United States Patent [19]

Ehrler et al.

[11] Patent Number: 4,761,210

[45] Date of Patent: Aug. 2, 1988

[54] METHOD FOR GENERATING STRUCTURES IN MICRO-MECHANICS

[75] Inventors: Günter Ehrler, Deisenhofen; Heinz Hagen, Neubiberg; Klaus Becker, Munich, all of Fed. Rep. of Germany

[73] Assignee: Siemens Aktiengesellschaft, Berlin and Munich, Fed. Rep. of Germany

[21] Appl. No.: 874,427

[22] Filed: Jun. 16, 1986

[30] Foreign Application Priority Data

Sep. 30, 1985 [DE] Fed. Rep. of Germany ....... 3534860

[51] Int. Cl.⁴ ................................................ C25F 3/14
[52] U.S. Cl. ................................................ 204/129.65
[58] Field of Search ................. 204/129.65; 156/661.1

[56] References Cited

U.S. PATENT DOCUMENTS

| | | | |
|---|---|---|---|
| 4,113,486 | 9/1978 | Sato | 204/129.65 |
| 4,135,964 | 1/1979 | Tanaka | 156/661.1 |
| 4,615,782 | 10/1986 | Namatsu et al. | 156/661.1 |

FOREIGN PATENT DOCUMENTS

| | | | |
|---|---|---|---|
| 30170 | 3/1977 | Japan | 156/661.1 |
| 0124230 | 9/1980 | Japan | 156/661.1 |

OTHER PUBLICATIONS

Chemical Abstracts, vol. 99, item 57518y entitled "Etching of Metals", published Aug. 22, 1983, p. 226.

*Primary Examiner*—T. M. Tufariello
*Attorney, Agent, or Firm*—Hill, Van Santen, Steadman & Simpson

[57] ABSTRACT

A method for generating patterned structures on a monolith substrate in micro-mechanics to permit the production of at least two successive structurings with the depths required in micro-mechanics. At least two different, selectively removable etching masks which are etchable by different etching agents are applied in sequence to the substrate. A first structuring or patterning step is then employed after the last etching mask has been generated. A further etching step occurs after the removal of the last etching mask through the use of the etching masks then remaining on the substrate. The removal of additional etching masks and generating further structuring steps are repeated until the number of etching steps that have been carried out is the same as the number of etching masks that had been originally present on the monolith substrate.

5 Claims, 2 Drawing Sheets

METHOD FOR GENERATING STRUCTURES IN MICRO-MECHANICS

BACKGROUND OF THE INVENTION

1. Field of the Invention

The present invention is in the field of generating patterned structures on a monolith substrate in micro-mechanics involving the use of a plurality of etching masks of different etching characteristics in sequence.

2. Description of the Prior Art

When a monolith whose structure includes different thicknesses or different depths is to be structured in micro-mechanics, such structures have heretofore been produced only with mechanical methods such as boring, milling, spark discharge erosion, or the like.

In semiconductor technology, structures having a depth between about 0.1 micron and 1 micron are usually generated on the surface of a semiconductor with standard photolithographic processes. Since the thickness of the photoresist layer employed is on the order of 1 micron to 4 microns, an arbitrary number of photolithographic structuring steps can be provided in sequence in semiconductor technology without the structures previously applied on the surface of the semiconductors and preceding structuring steps presenting an obstacle.

The standard photolithographic processes which are used in semiconductor technology cannot be transferred to micro-mechanics without further complications because structures having a depth of up to 500 microns and more are required in a monolith in micro-mechanics. A succession of sequential structuring steps such as are standard in semiconductor technology with standard photolithographic processes cannot be carried out by means of a photosystem in micro-mechanics. Even two successive structuring steps by means of photosystems are not possible in micro-mechanics.

SUMMARY OF THE INVENTION

The present invention provides a method of the type described which enables the manufacture of at least two successive patterned structurings with the type of depths that are required in micro-mechanics.

In keeping with the present invention, there is provided a method for generating patterned structures on a monolith substrate in micro-mechanics which involves applying a first etching mask over the substrate, and applying a second etching mask directly over the first etching mask. The first and second masks are selectively etchable by different etchants. Thereafter, a desired number of additional masks are applied over the second mask. The solid substrate is then successively structured through the etching masks, beginning with the etching mask applied last. The layer serving most recently as the etching mask is then removed, and structuring continues through the next mask, and so on.

In the method of the present invention, at least two different, selectively removable etching masks are successively applied to the monolith. Two respective etching masks are applied three-dimensionally on top of one another and are selectively etchable. The number of selectively removable etching masks applied to the monolith thereby defines the number of possible structuring steps. Structures having different thicknesses (depths) can be produced in the monolith with at least two structuring steps.

Selectively removable etching masks can, for example, include a titanium-gold alloy layer and second, a photoresist composition. A photoresist layer can be used in order to generate a titanium-gold etching mask from the titanium-gold alloy layer. The titanium-gold alloy layer is applied first, and then an auxiliary photoresist layer is generated on the titanium-gold mask. The structure of the photoresist layer is then imaged in the usual way and etched into the titanium-gold layer thus providing a titanium-gold etching mask. After the titanium-gold etching mask has been produced, a second mask composed, for example, of a photoresist material may be formed over the titanium-gold mask.

BRIEF DESCRIPTION OF THE DRAWINGS

Further advantages and a specific embodiment of the present invention will be made in conjunction with the attached drawings in which.

DESCRIPTION OF THE PREFERRED EMBODIMENTS

The fundamental steps of a two-stage etching method for applications in micro-mechanics are illustrated with reference to the embodiment illustrated in FIGS. 1 through 5.

Figure 1:
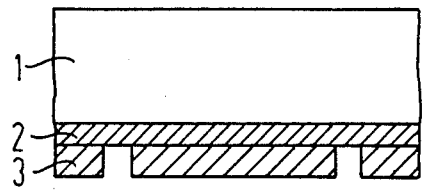
FIGS. 1 through 5 illustrate schematically the sequence of steps involved in carrying out the method of the present invention.

FIG. 1 shows a silicon wafer 1 which is a monolith substrate. The substrate has been vapor deposited with a surface-wide titanium-gold alloy layer 2. A photoresist layer 3 composed of a photoresist composition is applied to the titanium-gold layer 2, the photoresist layer 3 then being patterned or structured in accordance with standard photolithography processes available to a person reasonably skilled in the art.

Figure 2:
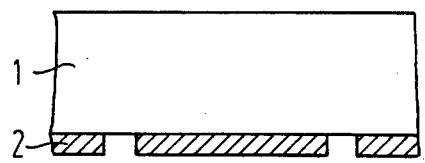

In the succeeding steps shown in FIG. 2, the titanium-gold layer 2 has been formed into a mask with the desired pattern by etching the titanium-gold layer 2 through the layer 3, and then removing the photoresist layer 3. The first etching mask has thus been generated from the titanium-gold layer 2 by structuring the titanium-gold layer 2. The structuring need not take place by means of a photoresist mask 3. The first etching mask likewise need not necessarily be composed of a titanium-gold alloy. The first etching mask may be composed of any material which is selectively removable in comparison to the second etching mask. The first etching mask can also be produced with any method by means of which a structured etching mask can be provided.

Figure 3:
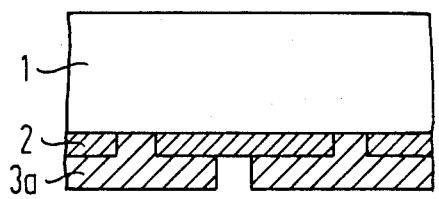

In FIG. 3, there is shown the silicon wafer of FIG. 2 having the first etching mask 2 adhering thereto and having a new photoresist mask 3a. This new photoresist mask 3a is applied over the first etching mask 2 and is then patterned by means of conventional photolithographic processes to provide a pattern therein which is different from the pattern in the underlying first etching mask 2. The photoresist mask 3a is also selectively etchable in comparison with the titanium-gold layer 2.

Figure 4:
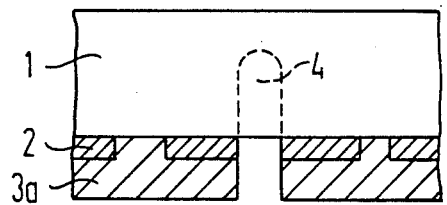

FIG. 4 shows the first structuring step consisting of the pre-etching of a through hole 4 by the use of the second etching mask 3a to a depth of about 300 micron. The etching mask 3a is then removed, leaving the first etching mask 2, as shown in FIG. 5.

Figure 5:
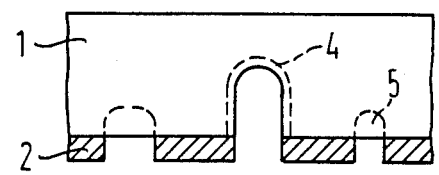

In FIG. 5, there is illustrated the structure which results after the second etching mask 3a has been removed and further portions of the silicon wafer 1 have been etched away in the through hole 4 as well as in depressions 5. These depressions are etched in the areas originally formed in the first etching mask 2 through the use of the first photoresist layer 3. In the second etching step, the through hole 4 is etched down to a depth of about 400 microns, and an annular groove 5 having a depth of about 100 microns is etched around this through hole 4. The mask 2 may then be removed.

Figure 6:
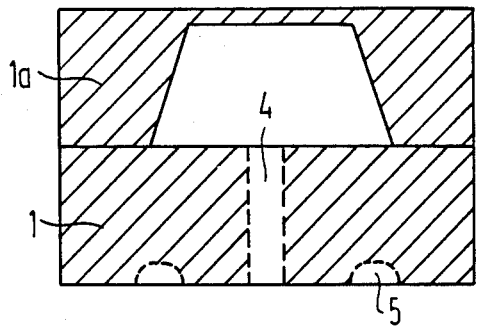
FIGS. 6 and 7 illustrate components of micro-mechanics that can be produced with the method of the present invention.

In FIG. 6, there is illustrated a relative pressure sensor which is composed of a silicon wafer 1 and of a further silicon wafer 1a. The silicon wafer 1 contains the through hole 4 and the annular groove 5.

Figure 7:
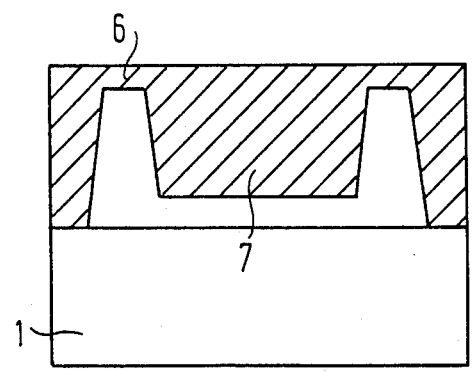

FIG. 7 illustrates a further application for the two-stage etching method in micro-mechanics. This Figure illustrates a doubly structured etching of a ring membrane 6. In the first etching step which corresponds to the first structuring step of the silicon wafer shown in FIG. 4, the pre-etching of the ring membrane 6 is accomplished. In the second etching step which corresponds to the second structuring step of the silicon wafer 1 shown in FIG. 5, the fine etching down to the final thickness of the ring membrane 6 is accomplished together with the thinning of the central island portion 7 which is carried out by etching. In the specific case of FIG. 7, the second etching step, i.e., the second structuring step of the silicon wafer, is composed of an electrochemical fine-etching method with an automatic etching stop. The erosion of the center island portion 7 is necessary in order to permit the free mobility of the ring membrane 6.

The component shown in FIG. 7 comprises a ring membrane 6 with a center island portion 7, in combination with a carrier wafer 1 as shown in FIG. 6, although this wafer has not been shown in greater detail in FIG. 7 for purposes of clarity. In the pressure sensor of FIG. 7, however, the carrier wafer 1 is structured similarly to the structure provided for the pressure sensor of FIG. 6.

In order to illustrate the specifics of the two-stage etching method, the layer thicknesses of FIGS. 1 through 5 have not been shown to scale in comparison with the thickness of the silicon wafer 1. The layers 2, 3, and 3a can be composed of whatever thicknesses are expedient. In particular, the etching masks 2 and 3a can comprise thicknesses between 0.1 and 10 microns. Various etching masks can be structured in chronological succession and spatially on top of one another. As a result of structuring with at least two etching masks, structures differing in depth can be generated in the silicon wafer 1 or in some other monolith. For example, structures can be produced differing in depth by more than 200 microns.

It should be evident that various modifications can be made to the described embodiments without departing from the scope of the present invention.

We claim as our invention:

1. A method for generating patterned structures on a monolith substrate in micro-mechanics which comprises:

providing a plurality of etching masks of different masking configurations in superimposed relation on said substrate, said masks being selectively etchable by different etchants, the first etching mask being composed of a titanium-gold alloy and the next succeeding mask being composed of a photoresist composition, structuring said substrate using the last mask to be applied by etching selected areas to a substantial depth, removing said last mask after said structuring, additionally structuring said substrate through the next to last mask to be applied by etching other selected areas to a different depth than in the original etching, and repeating the structuring and mask removals for each of the remaining masks.

2. A method acording to claim 1 wherein said plurality of masks consists of only two selectively etchable masks.

3. A method according to claim 1 which includes:

forming a relatively deep hole in said substrate in a first etching of said substrate, and enlarging said relatively deep hole and forming an annular groove of lesser depth about said hole in a subsequent etching step.

4. A method according to claim 1 which includes the steps of:

first etching an annular shape in said substrate and enlarging said shape and thinning the substrate within said annular shape in a subsequent etching step.

5. A method according to claim 1 wherein said etching is carried out by electrochemical fine etching.

* * * * *